United States Patent [19]
Jun et al.

[11] Patent Number: 5,654,223
[45] Date of Patent: Aug. 5, 1997

[54] METHOD FOR FABRICATING SEMICONDUCTOR MEMORY ELEMENT

[75] Inventors: Young Kwon Jun; Tae Gak Kim; Yoo Chan Jeon, all of Seoul, Rep. of Korea

[73] Assignee: LG Semicon Co., Ltd., Chungcheongbuk-do, Rep. of Korea

[21] Appl. No.: 495,270

[22] Filed: Jun. 27, 1995

[51] Int. Cl.$^6$ ............................................. H01L 21/70
[52] U.S. Cl. ........................................ 438/254; 438/397
[58] Field of Search ............................. 437/52, 47, 60, 437/919; 148/DIG. 14

[56] References Cited

U.S. PATENT DOCUMENTS

| | | | |
|---|---|---|---|
| 5,374,577 | 12/1994 | Tuan | 437/919 |
| 5,422,295 | 6/1995 | Choi et al. | 437/919 |
| 5,439,840 | 8/1995 | Jones, Jr. et al. | 437/52 |
| 5,460,999 | 10/1995 | Hong et al. | 437/919 |
| 5,536,673 | 7/1996 | Hong et al. | 437/60 |
| 5,567,639 | 10/1996 | Chang | 437/919 |

*Primary Examiner*—Tuan H. Nguyen
*Attorney, Agent, or Firm*—Morgan, Lewis and Bockius, LLP

[57] ABSTRACT

A method for fabricating a semiconductor memory element which has an excellent insulation property suitable for high density integration, including the steps of forming self-aligning plate electrodes by etching a dielectric film covering an upperside protective layer by an amount sufficient to expose each of the dielectric films, forming a third insulation film the entire surface thereof, exposing the upperside protection layer by etching the third insulation film with photosensitive films used as masks, forming a bit line contact by etching the upperside protection layer and the underside protection layer until the impurity region through the bit line contact.

20 Claims, 16 Drawing Sheets

F I G. 2A
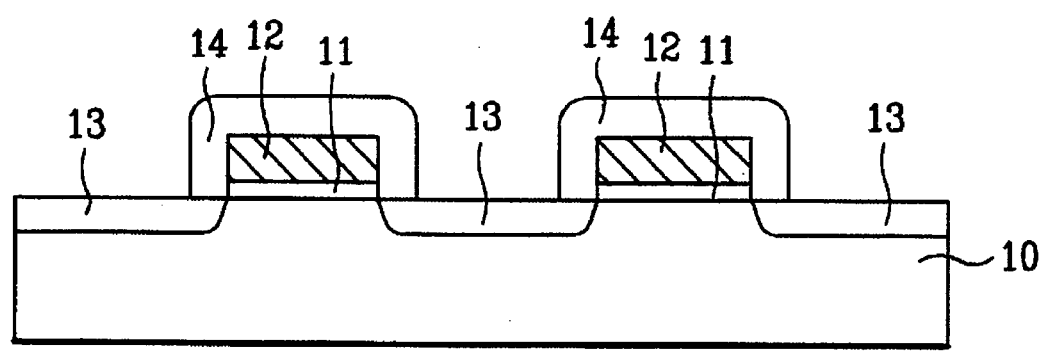
F I G. 2B
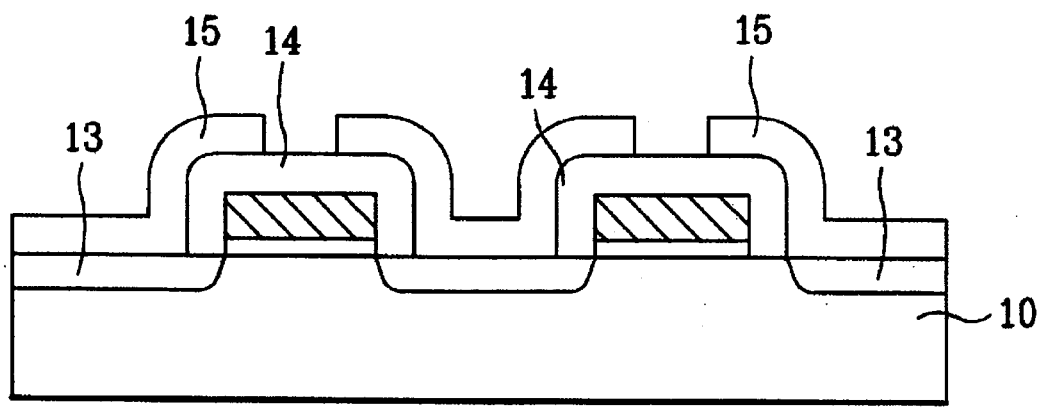

METHOD FOR FABRICATING SEMICONDUCTOR MEMORY ELEMENT

BACKGROUND OF THE INVENTION

1. Field of the Invention

This invention relates to a semiconductor memory element, more particularly to a method for fabricating a semiconductor memory element having excellent insulation property suitable for high density integration.

2. Description of the Related Art

A conventional semiconductor memory element having a stacked capacitor cell is fabricated through forming the stacked capacitor cell by successive stacking of storage electrodes, dielectric films, and plate electrodes on a silicon substrate having switching transistors formed thereon, and forming a bit line, finally.

FIG. 1 is a section of the conventional semiconductor memory element.

Referring to FIG. 1, the conventional semiconductor memory cell includes a semiconductor substrate 10, and switching transistors, stacked capacitors, and a bit line 21, formed on the substrate.

Each of the switching transistors has a gate insulation film 11 and gate 12 formed on the substrate 10, and impurity regions 13 for source/drain formed in the substrate 10 on both sides of the gate. Each of the stacked capacitors has a storage electrode 17 and a plate electrode 19 formed over the impurity region of the switching transistor, with a dielectric film 18 formed between the storage electrode 17 and the plate electrode 19.

The bit line 21 is formed over the impurity region 13 of the switching transistor between adjacent stacked capacitors, and an insulation film 20 is formed for insulating between the bit line 21 and the plate electrodes 19 of the stacked capacitors.

One each of a plug 15 is formed both between the storage electrode 17 of the stacked capacitor and the impurity region under the storage electrode 17 and between the bit line 21 and the impurity region 13 of the switching transistor under the bit line 21, and one each of an insulation film 14 or 16 is formed of insulating both between the gate 12 and the plug 15 and between the plug 15 and the storage electrode 17.

FIGS. 2A–2F show process steps for fabricating the conventional semiconductor memory element of FIG. 1.

First, as shown in FIG. 2A, switching transistors are formed on a semiconductor substrate 10. That is, gate insulation films 11 and gates 12 are formed on the substrate 10, and impurity regions 13 for sources/drains are formed in the substrate 10 on both sides of each gate by injecting impurity ions thereto. Then, insulation films 14 are formed on the surface thereof excluding the impurity regions 13.

As shown in FIG. 2B, plugs 15 are formed by depositing a continuous layer of conductive material and subjecting it to patterning to leave the material on the surface of the impurity regions 13, and as shown in FIG. 2C, insulation films 16 are formed on portions of the surfaces of the plugs 15.

As shown in FIG. 2D, each of the stacked capacitors is formed by successive forming of a storage electrode 17 which makes contact with the impurity region through the plug 15, a dielectric film 18, and a plate electrode 19 as shown in FIG. 2E, a bit line contact 22 is formed by forming an insulation film 20 and removing the insulation film 20 over the plug 15 between the stacked capacitors. Finally, the bit line 21 is formed on the insulation film 20 to make contact with the exposed plug 15 through the bit line contact 22 to complete the conventional semiconductor memory cell as shown in FIG. 2F.

In the foregoing semiconductor memory element, the distance between the bit line 21 and the plate electrodes 19 of the capacitors insulated by the insulation film 20 becomes reduced as the semiconductor memory elements are highly integrated. Therefore, in case of misalignment during the formation of the bit line contact as the distances between the bit line and the plate electrodes of the stacked capacitors become smaller, with the insulation film 20 between them being thinner, there has arisen a problem of reduced insulation property. In case the misalignment is serious, shorts can happen between the plate electrodes and the bit line.

SUMMARY OF THE INVENTION

An object of the present invention is to resolve the foregoing problem of the conventional art by providing a method for fabricating a semiconductor memory element, having an improved insulation property between a plate electrode of a capacitor and a bit line by forming a self-aligning plate electrode of the capacitor.

Another object of the present invention is a method for fabricating a semiconductor memory element having excellent insulation properties suitable for high density integration.

These and other objects and features of the present invention are achieved by a method for fabricating a semiconductor memory element comprising the steps of the successive formation of gate insulation films and gates on a substrate forming impurity regions in the substrate on both sides of each of the gates by injecting impurity ions thereto, forming a first insulation film on the surface thereof, forming storage electrode contacts to the impurity regions on one side of each of the gates and an underside protection layer on the impurity region on the other side of each of the gates by subjecting the first insulation film to etching to expose the impurity regions on one side of each of the gates, forming a plurality of layered storage electrodes each making contact to the impurity region through the contact, forming a plurality of layered sacrificing layers on each of the storage electrodes, forming sacrificing sidewall spacers at sidewalls of each of the storage electrodes and the sacrificing layers, forming a second insulation film over the entire surface thereof, forming an upperside protection layer on the underside protection layer and exposing the sacrificing layers by subjecting the second insulation layers to etching, exposing the storage electrodes by etching the exposed sacrificing layers and subsequently etching the sacrificing sidewall spacers, forming a dielectric film on each of the exposed storage electrodes, and forming a self-aligned plate electrode on each of the dielectric films by etching the dielectric film to a depth sufficient to expose the upperside protection layer.

BRIEF DESCRIPTION OF THE DRAWINGS

FIGS. 2A–2F show the steps of a method for fabricating the conventional semiconductor element of FIG. 1.

DETAILED DESCRIPTION OF THE INVENTION

Embodiments of the process of the present invention are explained in detail hereinafter with reference to the attached drawings.

Figure 1:
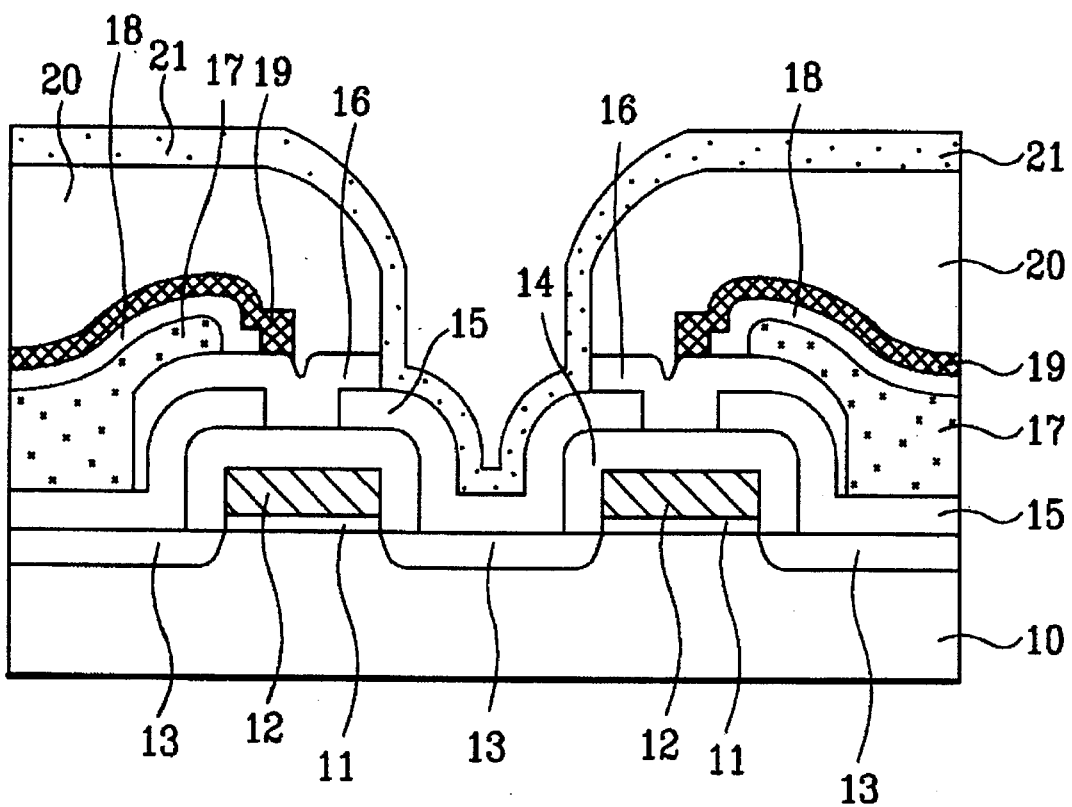
FIG. 1 is a cross section of a conventional semiconductor element.
Figure 2C:
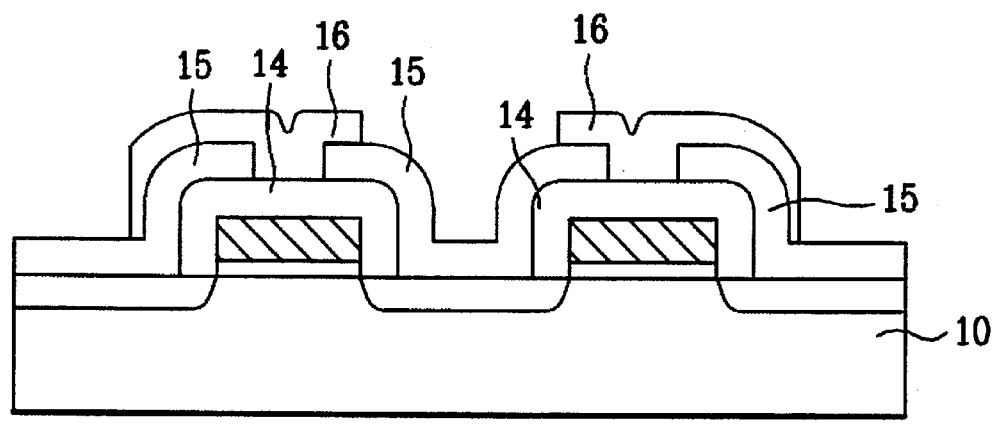
Figure 2D:
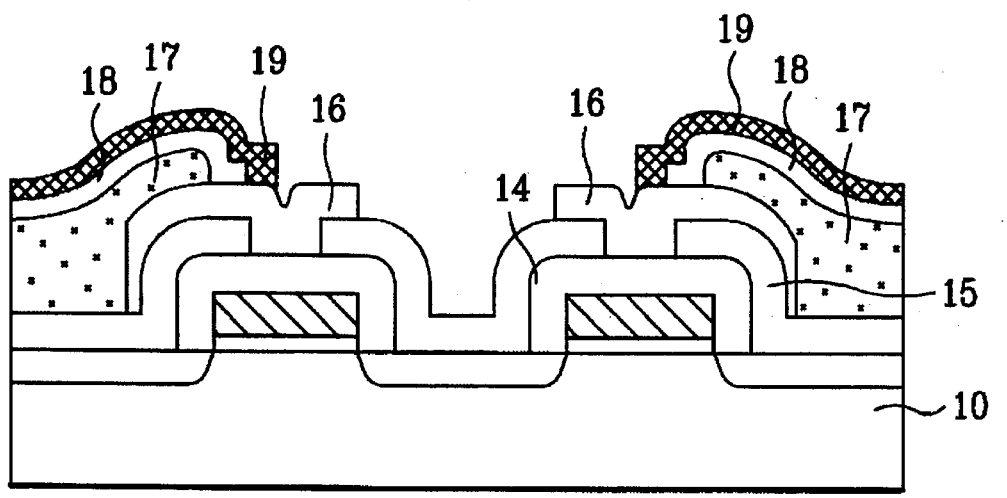
Figure 2E:
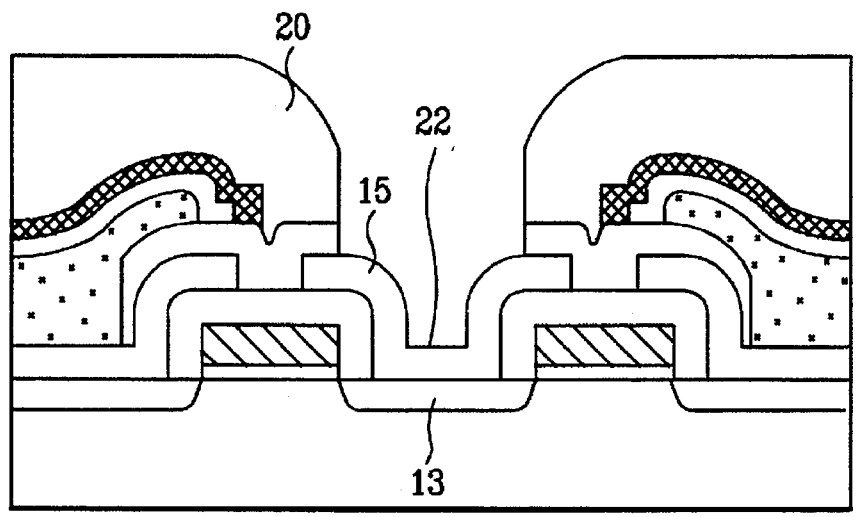
Figure 2F:
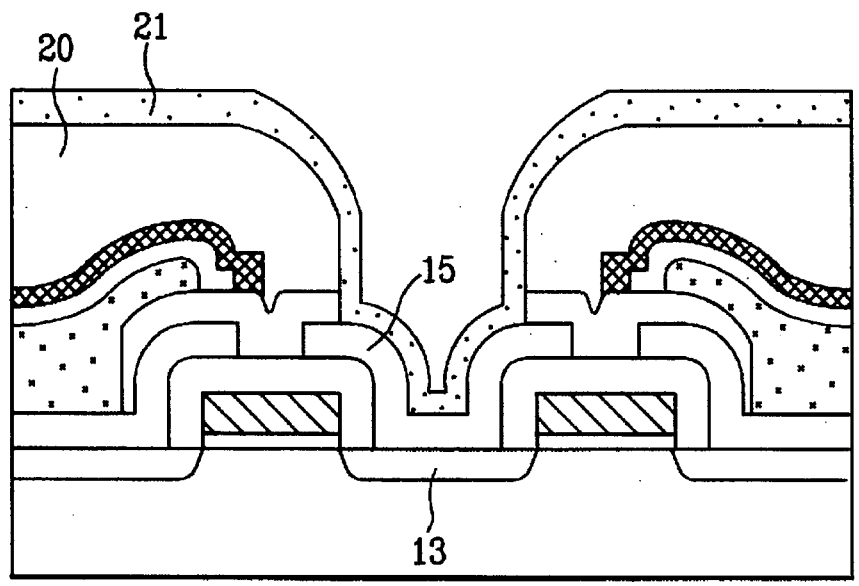
Figure 3A:
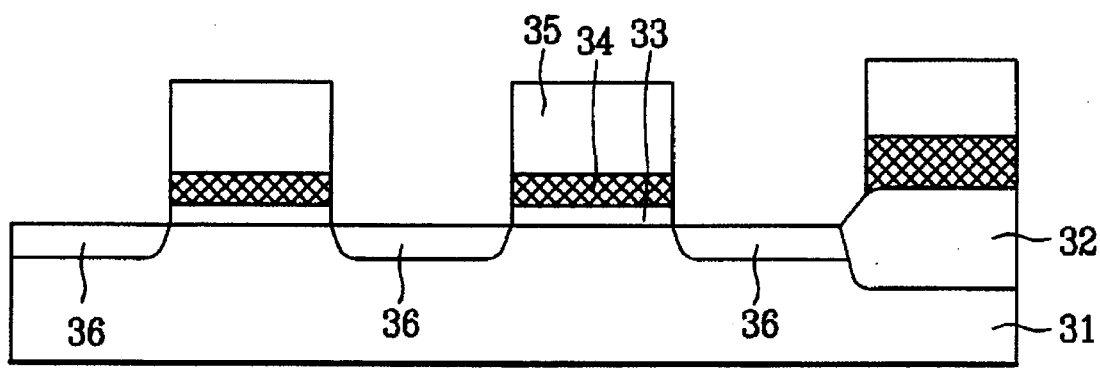
FIGS. 3A–3N show the steps of a first embodiment of a method for fabricating a semiconductor element in accordance with the present invention.
Figure 3B:
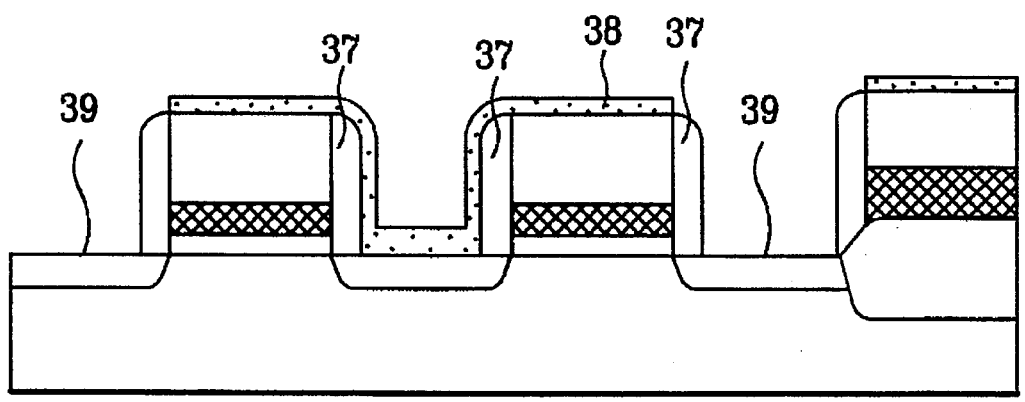
Figure 3C:
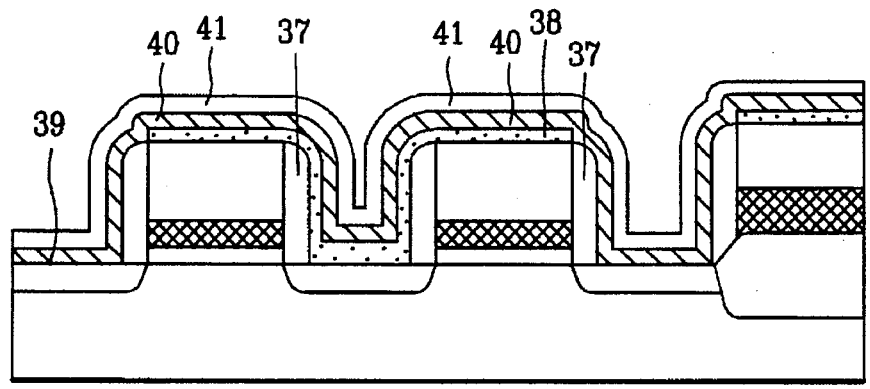
Figure 3D:
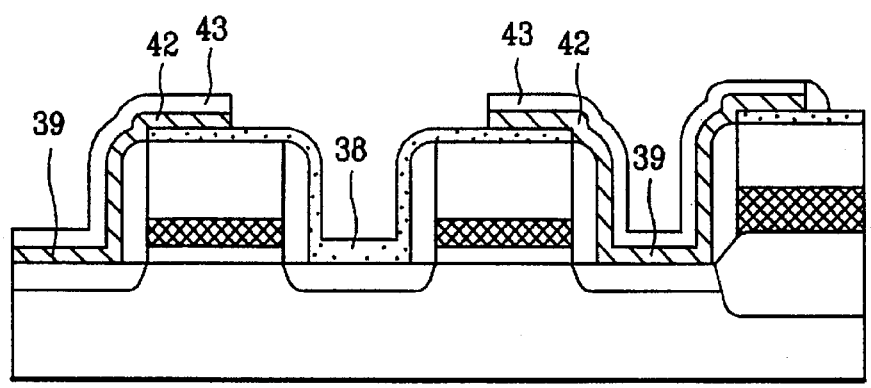
Figure 3E:
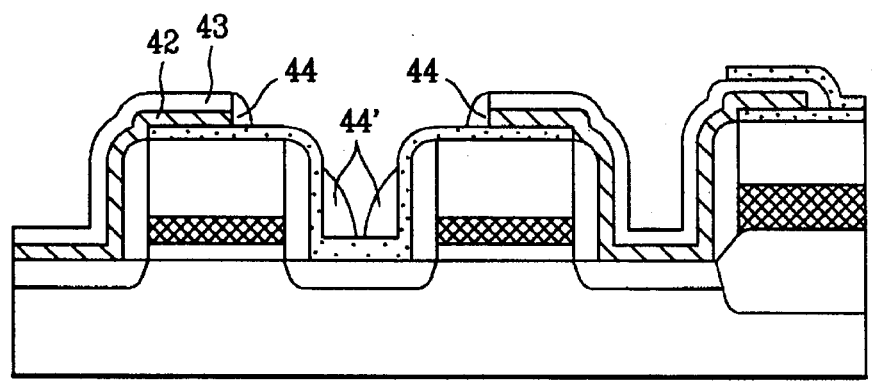
Figure 3F:
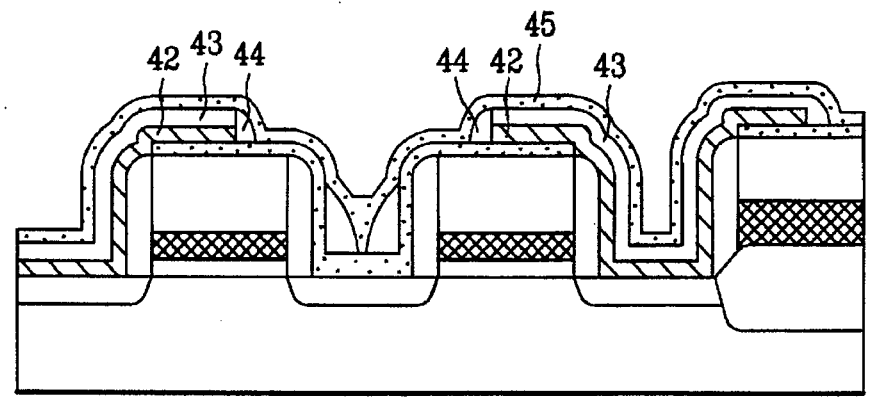
Figure 3G:
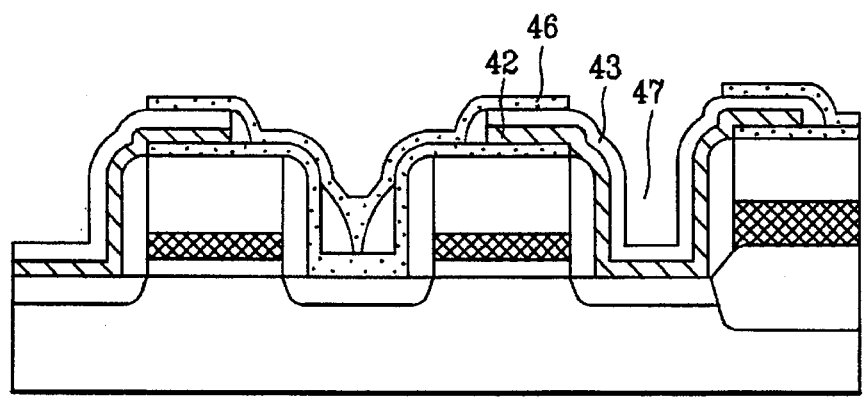
Figure 3H:
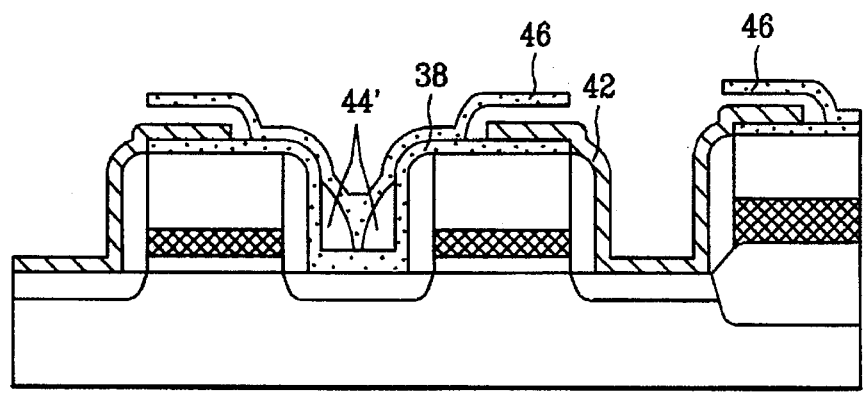
Figure 3I:
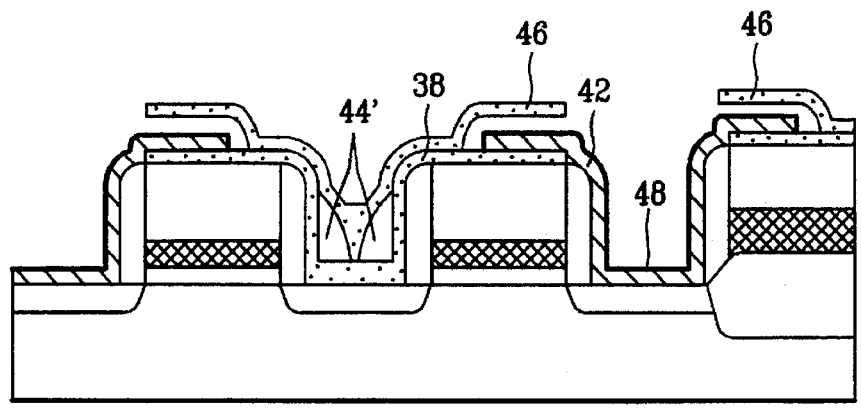
Figure 3J:
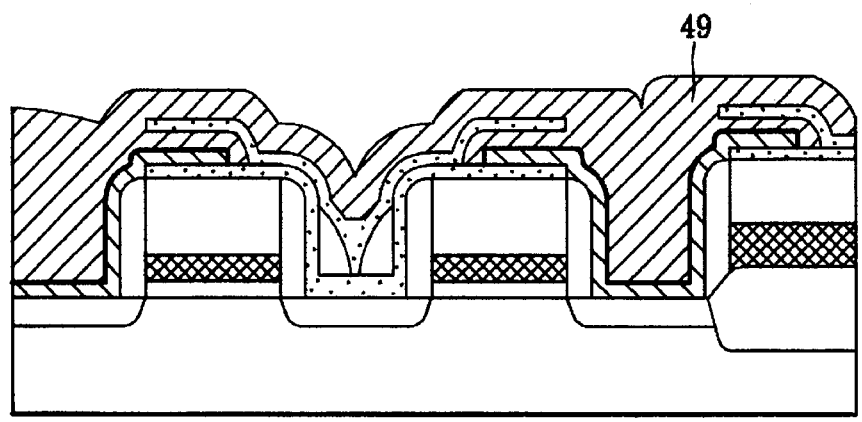
Figure 3K:
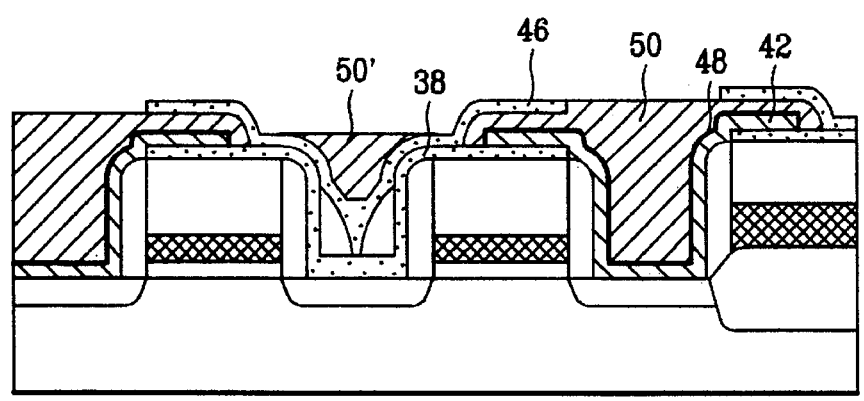
Figure 3L:
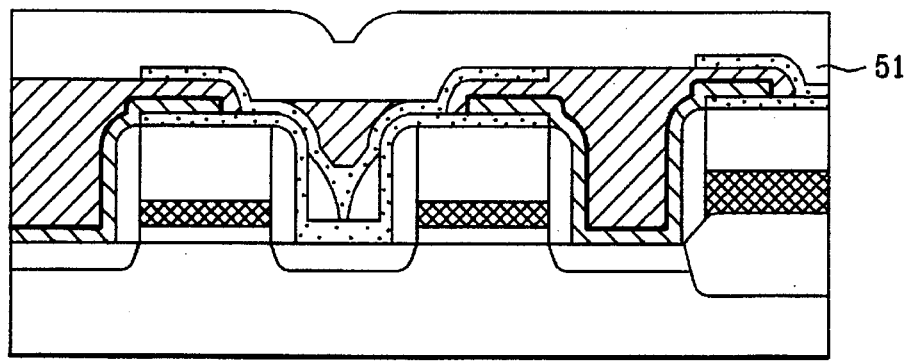
Figure 3M:
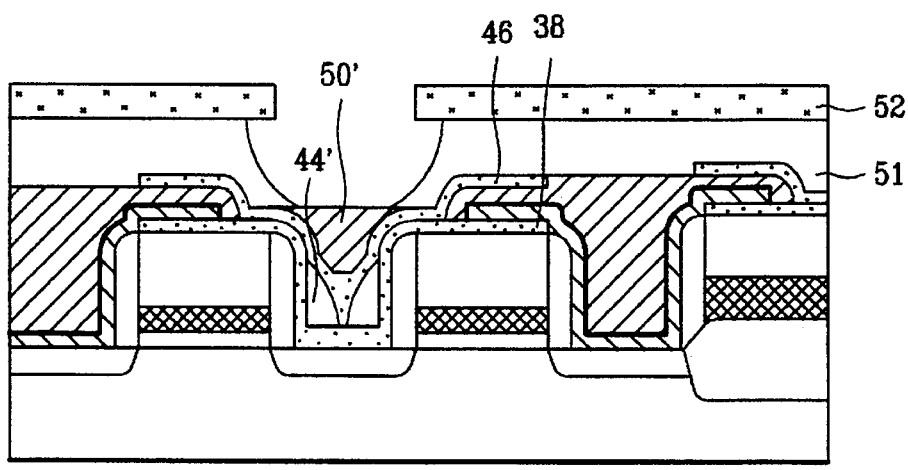
Figure 3N:
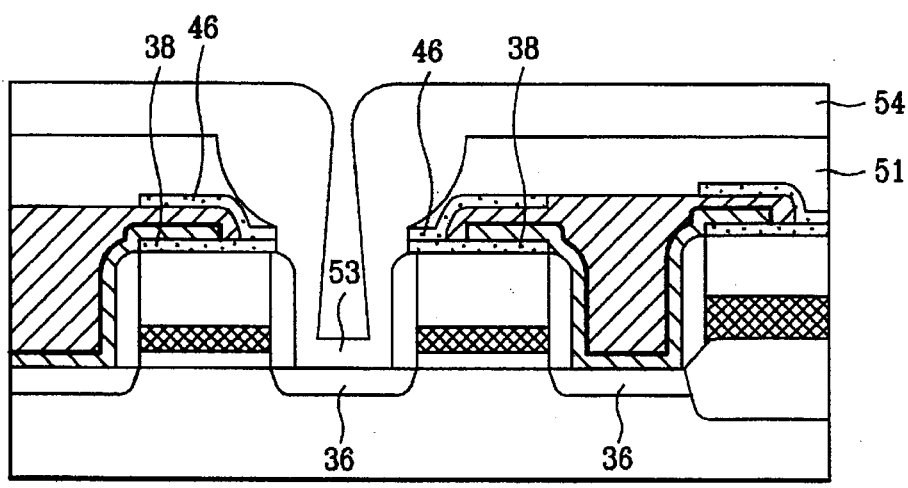

FIGS. 3A–3N show a first embodiment of a method for fabricating a semiconductor element with a stacked capacitor cell in accordance with the present invention.

As shown in FIG. 3A, a field oxide film 32 is formed on a field region of a substrate for separating elements.

Switching transistors for the semiconductor elements are formed by the successive formation of gate insulation films 33, gates 34, and cap oxide films 35 on an active region of the substrate. Impurity regions 36 are also formed for sources/drains in the active region of the substrate by injecting impurity ions using the gate structures as masks.

As shown in FIG. 3B, side wall spacers 37 are fabricated on both sides of each of the gate structures, i.e., the sets of the gate insulation films 33, the gates 34, and the cap oxide films 35 by forming in insulation film of an oxide film on all over the surface thereof and subjecting it to a conventional etch back process, the impurity regions 36 are exposed at the same time.

By depositing an insulation film on the surface thereof to a thickness of 500 to 1500 Å and subjecting the insulation film to selective etching with a storage electrode contact mask, an underside protection layer 38 as well as storage electrode contacts 39 are formed. The impurity region having the underside protection layer 38 thereon is a part of a bit line contact to be formed, and each of the impurity regions having the storage electrode contact 39 thereto is a part a storage electrode to be formed.

The insulation film used as the underside protection layer 38 is formed of a material having an etch selectivity over an oxide film, such as a nitride film.

As shown in FIG. 3C, a polycrystalline silicon film 40 is deposited to a thickness of 1000 to 2000 Å at 560 to 620 deg. C by a chemical vapor deposition method, with $SiH_4$ or $Si_2H_6$ used as a raw material gas and $PH_3$ used as a doping gas, and an insulation film 41 is formed thereon to a thickness of 1000 Å.

As shown in FIG. 3D, sacrificing layers 43 are formed by etching the insulation film 41. Storage electrodes 42, each in contact with the impurity region 36 through the storage electrode contact 39, are formed by etching the polycrystalline silicon film 40. The underside protection layer 38 is exposed following the formation of the storage electrodes. The insulation film used as the sacrificing layer is formed of an oxide film.

As shown in FIG. 3E, by depositing an insulation film formed of a metal identical to the sacrificing layers 43 to a thickness of 1000 to 1500 Å and subjecting it to etching back to a depth greater than the deposited thickness, sacrificing side wall spacers 44 are formed at sidewalls of the storage electrodes 42 and the sacrificing layer 43. The sacrificing side wall spacers 44' are also formed at sidewalls of the underside protection layer on the impurity region 36.

As shown in FIG. 3F, by depositing an insulation film 45 over the entire surface of the device to a thickness of 500 to 1500 Å and subjecting the insulation film 45 to etching as shown in FIG. 3G, an upperside protection layer 46 is formed on the underside protection layer 38. Due to formation of windows 47 by the formation of the upperside protection layer 46, the sacrificing layers 43 are exposed.

The upperside protection layer 46 is formed of a material identical to the underside protection layer 38, and each one of the storage electrodes 42, the sacrificing layers 43, and the sacrificing sidewall spacer 44 at positions over each of the gates 34 have been formed enclosed between the upperside, and the underside protection layers 46 and 38.

As shown in FIG. 3H, the exposed sacrificing layers 43 are removed through the windows 47. Following removal of the sacrificing layers 43, the sacrificing sidewall spacers 44 at sides of the storage electrodes 43 are also exposed and then removed. Through the removal of the sacrificing layers 43 and the sacrificing sidewall spacers 44, the storage electrodes 42 in the windows 47 are exposed. The sacrificing layers 43 and the sacrificing sidewall spacers 44 are wet etched with a solution containing hydrofluoric acid HF.

As shown in FIG. 3I, dielectric films 48 are formed on each of the exposed surfaces of the storage electrodes 42, and as shown in FIG. 3J, a polycrystalline silicon film 49 is deposited to a thickness of 2060 to 3000 Å over the entire surface so that the windows 47 each having the sacrificing layers 43 and the sacrificing sidewall spacer 44 removed therefrom are fully filled with the polycrystalline silicon film 49.

The polycrystalline silicon film 49 is formed at 560 to 620 deg.C with a chemical vapor deposition method, with $SiH_4$ or $Si_2H_6$ used as a raw material gas and $PH_3$ used as a doping gas.

As shown in FIG. 3K, by subjecting the polycrystalline silicon film 49 to etch back to a depth more than the deposited thickness, plate electrodes 50 are formed on the dielectric films 48. Accordingly, each of the plate electrodes 50 can be formed in self-alignment without using any mask.

Figure 5A:
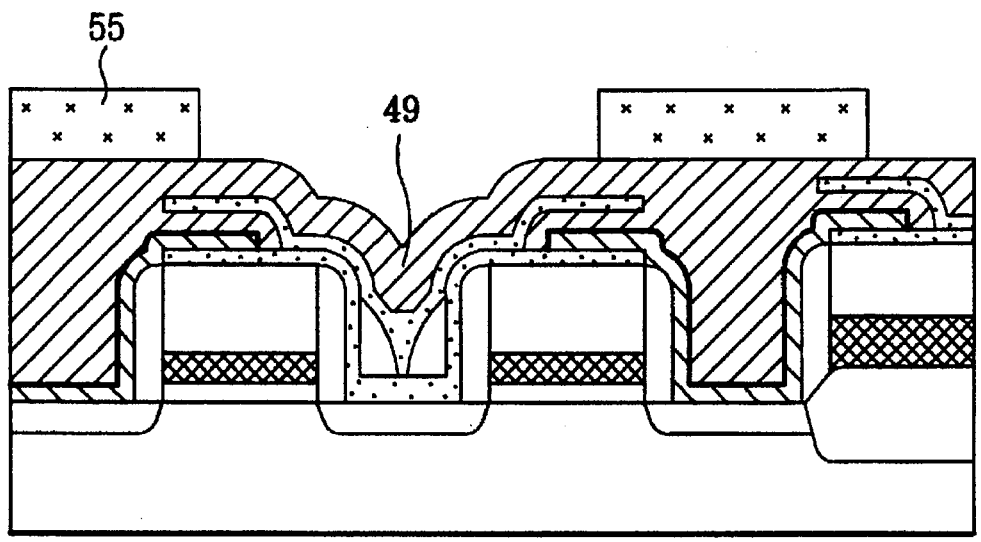
FIGS. 5A and 5B show cross sections of memory cells formed by the method for forming plate electrodes of the semiconductor element in accordance with the present invention.
Figure 5B:
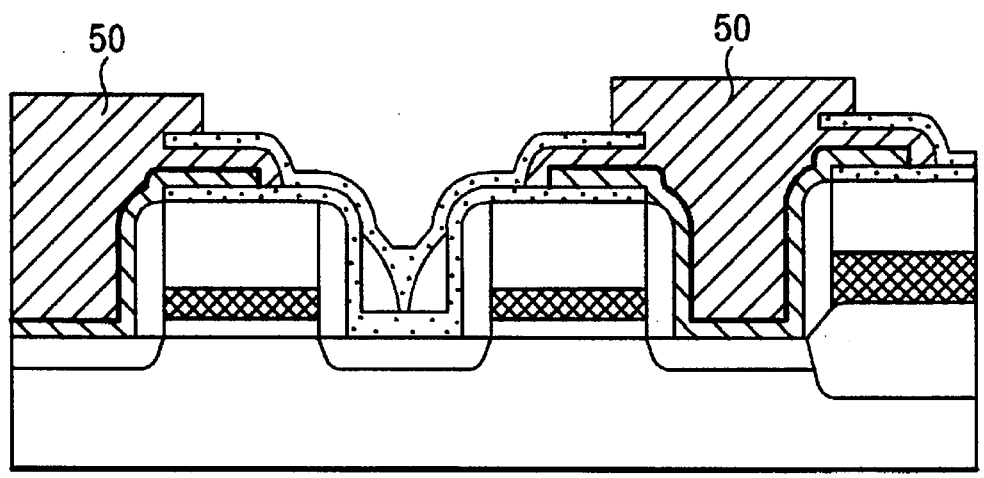

In this invention, besides the method for forming the plate electrodes 50 shown in FIGS. 3J and 3K by depositing the polycrystalline silicon film 49 with a chemical deposition method and etching back the silicon film 49, the plate electrodes 50 can be formed using a method shown in FIGS. 5A to 5B. That is, as shown in FIG. 5A, the polycrystalline silicon film 49 is deposited over the entire surface and a photosensitive film 55 is coated thereon, and then the photosensitive film 55 is patterned to remove the photosensitive film 55 except at the location of the bit line contact to be formed. As shown in FIG. 5B, the polycrystalline silicon film 49 is etched into the plate electrodes 50, with the photosensitive films 55 used as masks.

As shown in FIG. 3L, by forming an insulation film 51 between the bit line and the plate electrodes to a thickness of 5000 to 7000 Å over the entire surface and subjecting it to annealing, the surface is planarized. That is, by depositing a doped oxide film, such as BPSG through chemical vapor deposition, as the insulation film 51 and annealing it at 600 to 900 deg.C, steps at the surface thereof are moderated.

As shown in FIG. 3M, a photosensitive film 52 is coated on the insulation film 51, and the part of the insulation film 51 where the bit line contact is to be formed is exposed. By subjecting the insulation film 51 to isotropic etching with the remaining photosensitive film 52 used as a mask, the polycrystalline silicon film 50' that remained on the top of the upperside protection layer 46 is exposed. Herein, the insulation film 51 is wet etched with a solution containing hydrofluoric acid HF.

As shown in FIG. 3N, by successive etching of the remaining polycrystalline silicon film 50', the upperside protection layer 46, the sacrificing sidewall spacers 44', and the underside protection layer 38, a bit line contact 53 is formed. The bit line contact is formed by dry etching with $SF_6$ or $Cl_2$ gas.

Finally, by depositing a conductive material, such as aluminum on the surface thereof by chemical vapor deposition and subjecting it to patterning, a bit line in contact with the impurity region through the bit line contact 53 is formed.

With the first embodiment, the upperside, and underside protection films each formed of an insulation film having an etching selectivity over an oxide film, not only protect the plate electrodes at the time of forming the bit line contact, but also act to maintain a distance between the bit line and each of the plate electrodes of the capacitors at least as much as the deposited thickness of the upperside protection layer, and also to maintain a distance between each of the adjacent storage electrodes and plate electrodes of the capacitors equal to the thickness of the sacrificing sidewall spacer.

FIGS. 4A–4M show a second embodiment of the method for fabricating the semiconductor element having a pin structured, stacked capacitor cell in accordance with the present invention.

Figure 4A:
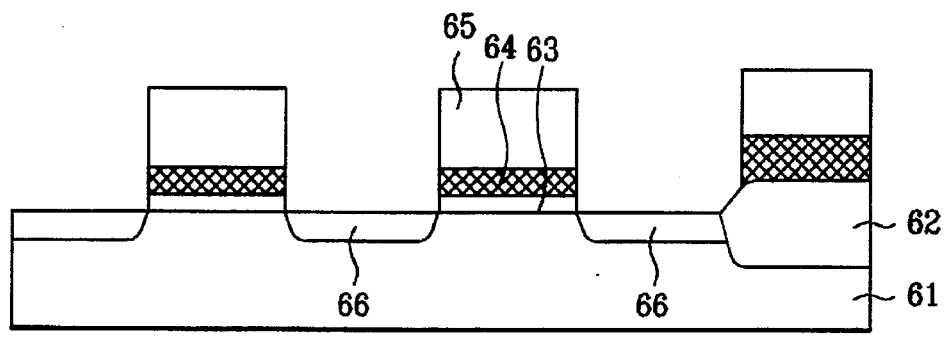
FIGS. 4A–4M show the steps of a second embodiment of the method for fabricating the semiconductor element in accordance with the present invention.

As shown in FIG. 4A, a filed oxide film 62 is formed on a field region of the substrate 61 for the purpose of separating elements.

The formation of switching transistors of the semiconductor element is completed by the successive formation of gate insulation films 63, gates 64, and cap oxide films 65, each of them making up a gate set, on an active region of the substrate, and forming impurity regions 66 for sources/drains in the active region of the substrate by injecting impurity ions using the gate sets as masks.

Figure 4B:
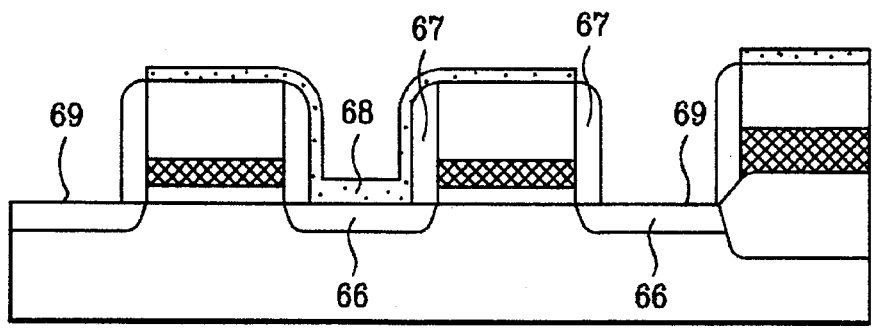

As shown in FIG. 4B, by forming an insulation film of an oxide film over the entire surface and subjecting it to a conventional etch back process, side wall spacers 67 at both sides of each of the sets of the gate insulation films 63, the gates 64, and the cap oxide films 65 are formed and the impurity regions 66 are exposed, at the same time.

By depositing an insulation film on the surface thereof to a thickness of 500 to 1500 Å and subjecting the insulation film to selective etching by using a storage electrode contact mask, an underside protection layer 68 is formed and storage electrode contacts 69 are formed by exposing the impurity regions 66 at the same time.

The insulation film used as the underside protection layer 68 is formed of a material having an etch selectivity over an oxide film, such as a nitride film.

Figure 4C:
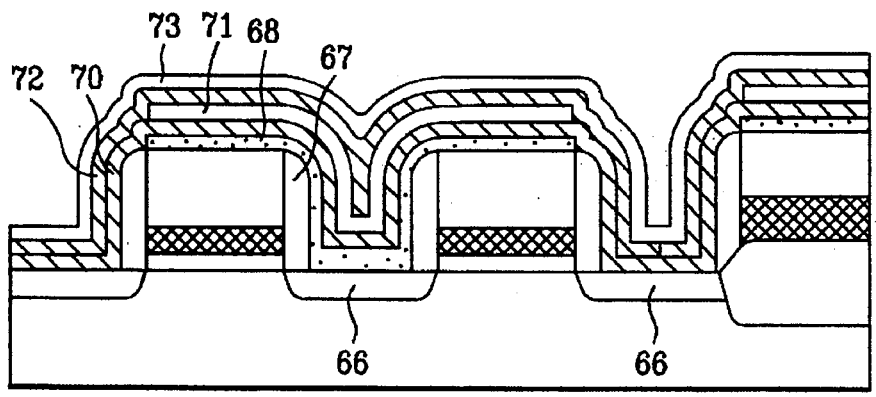

As shown in FIG. 4C, a first polycrystalline silicon film 70 is deposited to a thickness of 1000 to 2000 Å at 560 to 620 deg. C with a chemical vapor deposition method, with $SiH_4$ or $Si_2H_6$ used as a raw material gas and $PH_3$ used as a doping gas. A first oxide film 71 is formed on the first polycrystalline silicon film 70 to a thickness of 500 to 1000 Å, and the first oxide film is patterned to leave it only on the firm polycrystalline silicon film 70 on the underside protection film 68. A second polycrystalline silicon film 72 is formed on the first polycrystalline silicon film 70 covering the first oxide film 71. A second oxide film 73 is formed on the second polycrystalline silicon film 72.

Figure 4D:
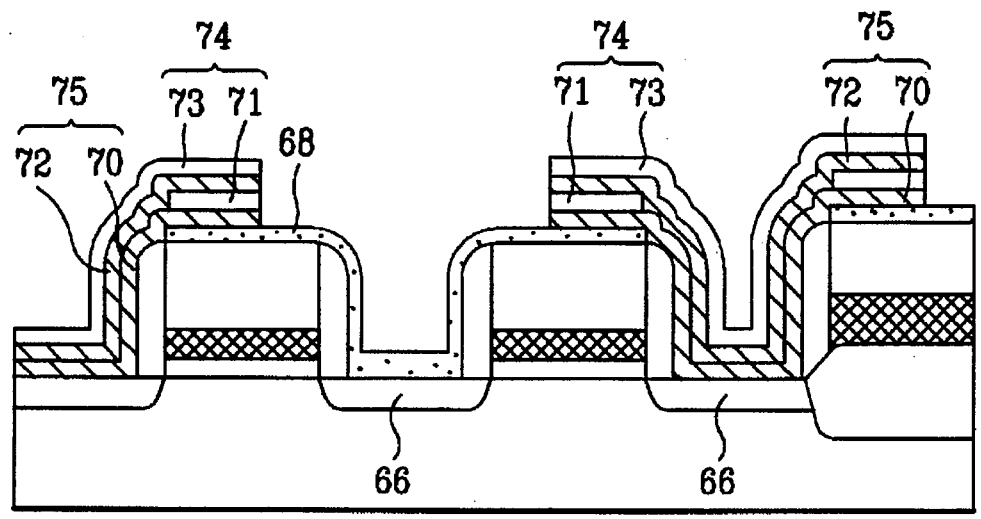

As shown in FIG. 4D, by successive etching of the second and first polycrystalline silicon films 72 and 70, and the second and first oxide films 73 and 71, storage electrodes 75 and sacrificing layers 74 are formed in the capacitor regions. Each of the sacrificing layers 74 is made up of the first and second oxide films 71 and 73, and each of the storage electrodes 75 is made up of the first and second polycrystalline silicon films 70 and 72.

Since the second embodiment of this invention is for forming a two pin structured stacked capacitor cell, bilayered storage electrodes and sacrificing layers are formed.

Figure 4E:
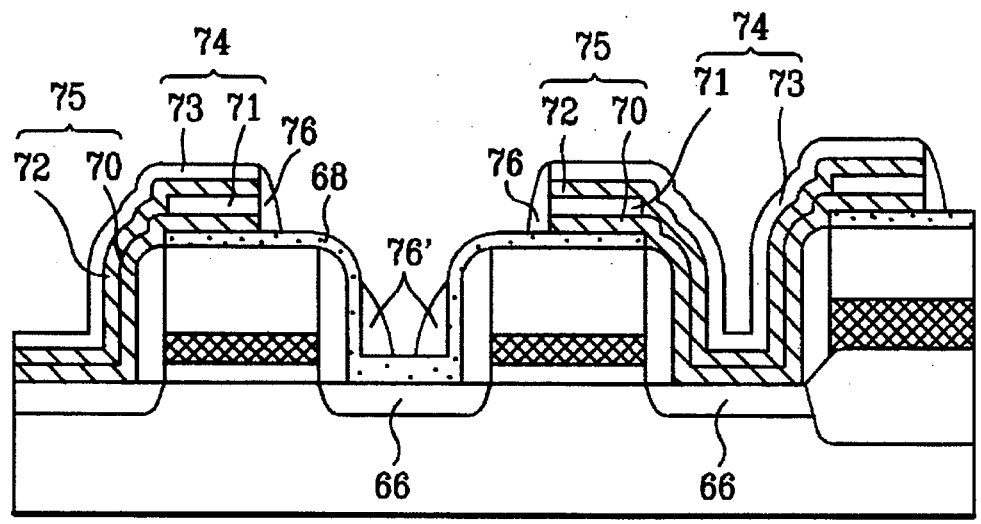

As shown in FIG. 4E, by depositing an insulation film formed of a material identical to the sacrificing layers 74 to a thickness of 1000 to 1500 Å and subjecting it to etch back to a depth more than the deposited thickness, sacrificing side wall spacers 76 are formed at sidewalls of the storage electrodes 75 and the sacrificing layer 74. At this time, sacrificing sidewall spacers 76' are also formed at sidewalls of the underside protection layer 68.

Figure 4F:
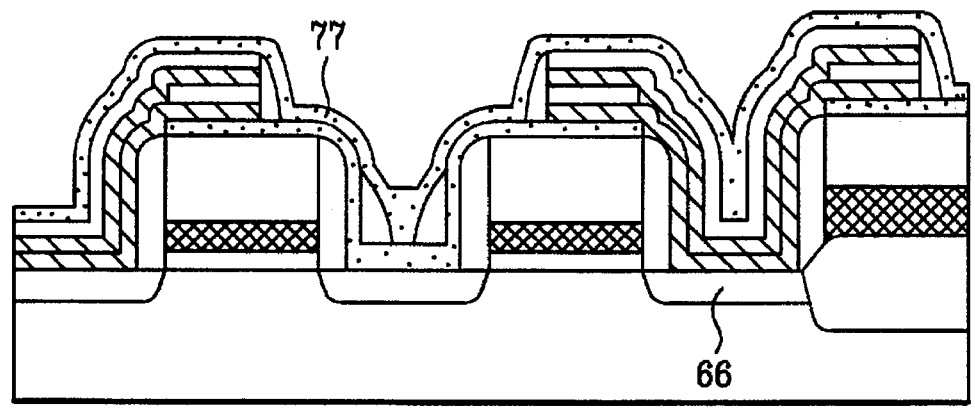
Figure 4G:
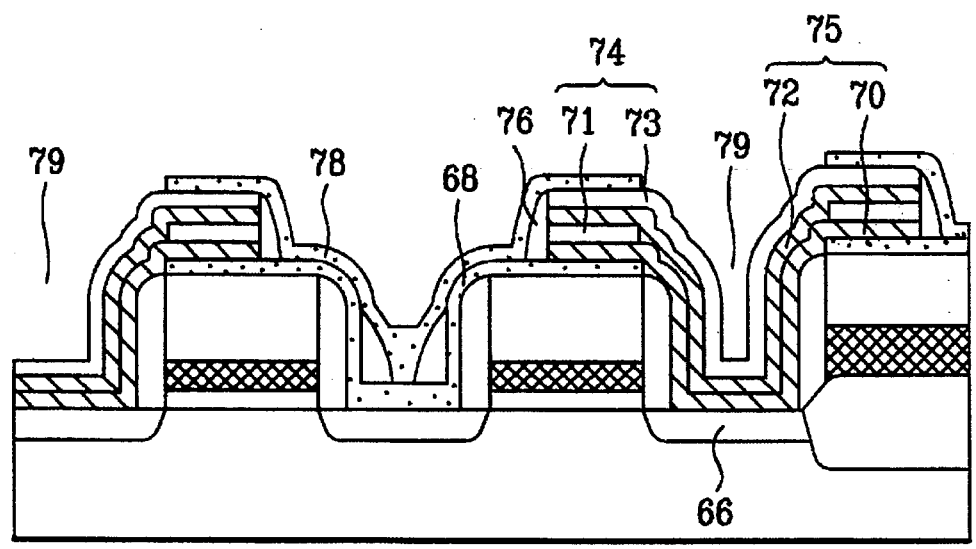

As shown in FIG. 4F, by depositing an insulation film 77 formed of a material identical to the underside protection layer over the entire surface to a thickness of 500 to 1500 Å and subjecting the insulation film 77 to etching as shown in FIG. 4G, an upperside protection layer 78 is formed on the underside protection layer 68.

Due to formation of windows 79 by the formation of the upperside protection layer 78, the second oxide films 73 making up the sacrificing layer 43 are exposed.

The upperside protection layer is formed of a material identical to the underside protection layer 68, and on each of the storage electrodes 74, the sacrificing layers 75, and the sacrificing sidewall spacers 76 at positions over each of the gates 64 have been formed to be enclosed between the upperside and the underside protection layers 78 and 68.

Figure 4H:
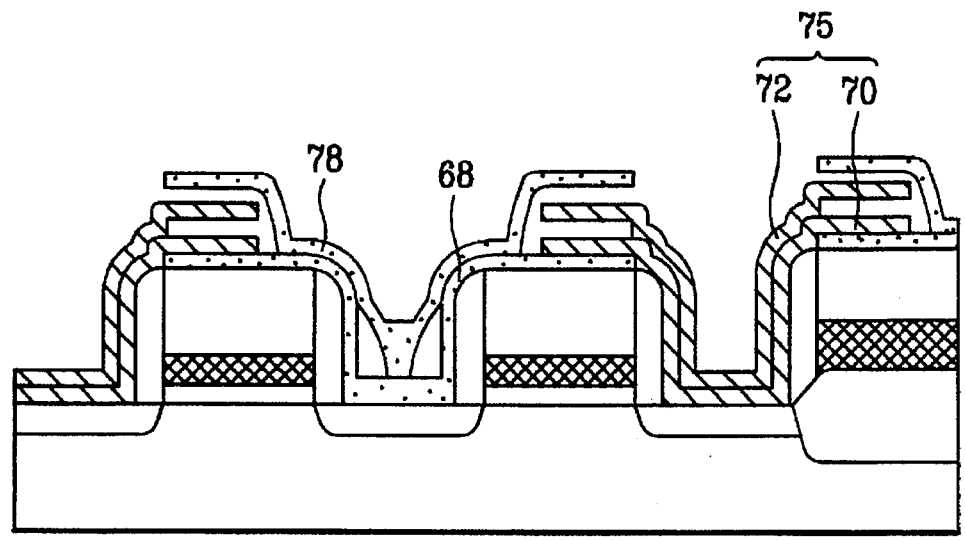

As shown in FIG. 4H, the exposed second oxide films 73 are removed through the windows 79, and then, the sacrificing sidewall spacers 76 at sidewalls of the storage electrodes 75 are also removed and the first oxide films 71 are also removed to expose the storage electrodes 75. At this time, the sacrificing layers 74 and the sacrificing sidewall spacers 76 are wet etched with a solution containing hydrofluoric acid HF.

Figure 4I:
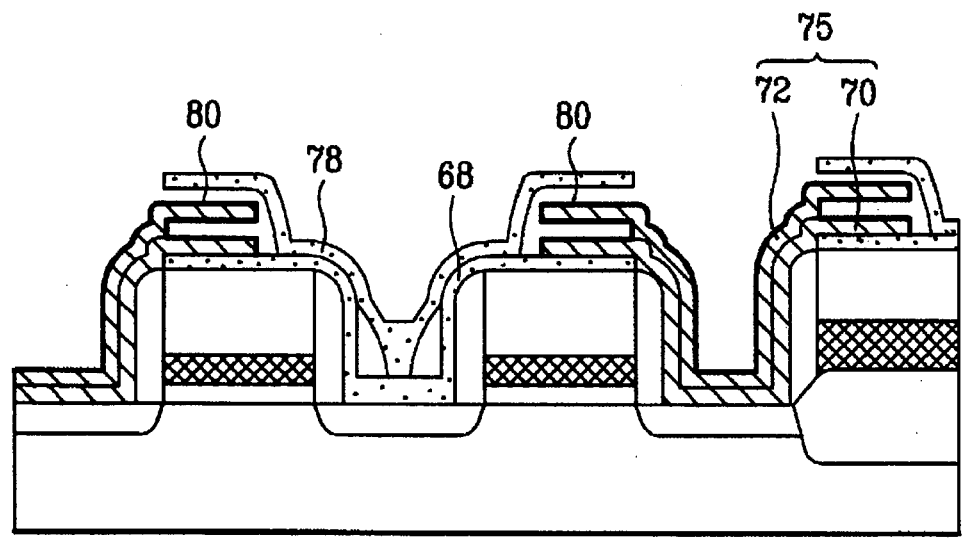
Figure 4J:
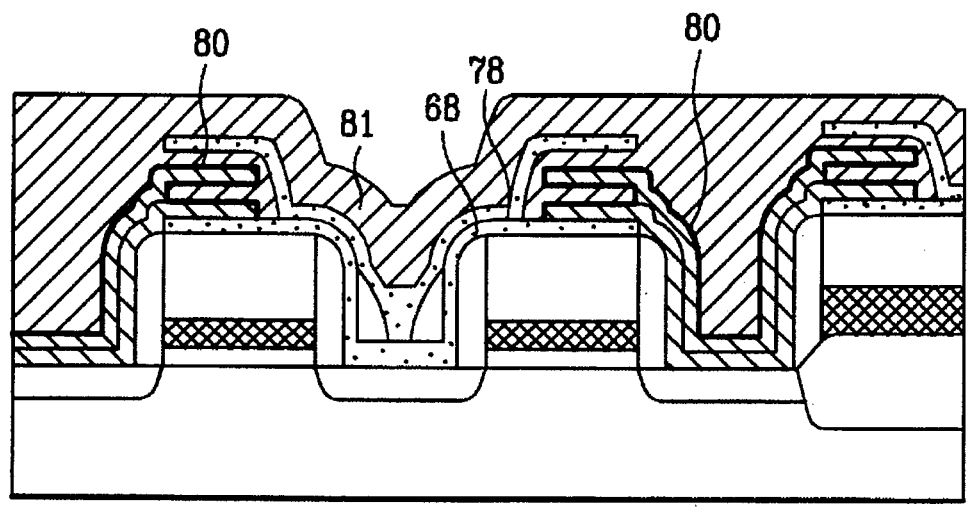

As shown in FIG. 4I, dielectric films 80 are formed on each of the exposed surfaces of the storage electrodes 75, and as shown in FIG. 4J, a polycrystalline silicon film 81 is deposited to a thickness of 2000 to 3000 Å over the entire surface so that the windows 79 each having the sacrificing layer 74 and the sacrificing sidewall spacer 76 removed therefrom are fully filled with the polycrystalline silicon film 81.

The polycrystalline silicon film 81 is formed at 560 to 620 deg.C by chemical vapor deposition with $SiH_4$, or $Si_2H_6$ used as a raw material gas and $PH_3$ used as a doping gas.

Figure 4K:
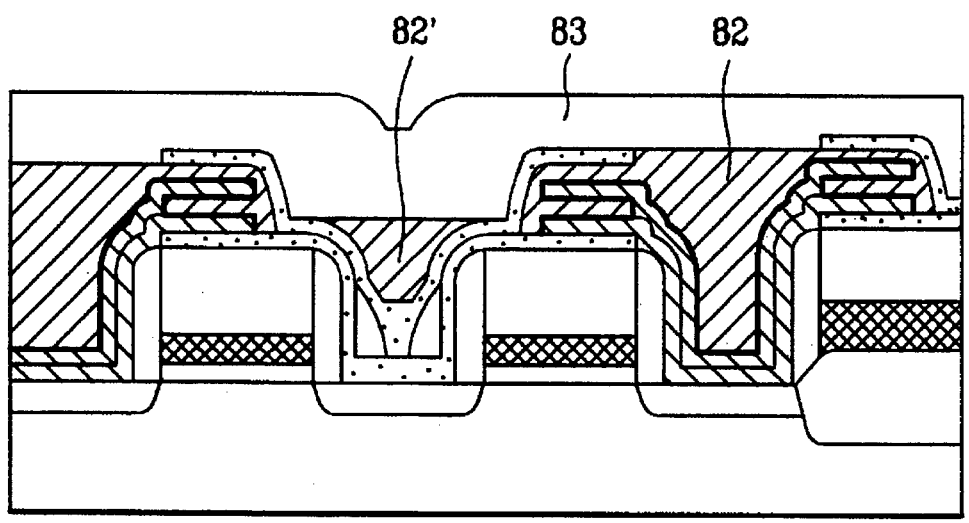

As shown in FIG. 4K, by subjecting the polycrystalline silicon film 81 to etch back to a depth more than the deposited thickness, plate electrodes 82 are formed on the dielectric films 80. Accordingly, the plate electrodes 82 can be formed in self-alignment without using any mask.

In this second embodiment, the plate electrodes 82 can also be formed using the method shown in FIGS. 5A to 5B.

By forming an insulation film 83 of, for example BPSG, for insulating between the bit line and the plate electrodes to a thickness of 5000 to 7000 Å over the entire surface with chemical vapor deposition and subjecting it to annealing at 600 to 900 deg.C, the surface is planarized.

Figure 4L:
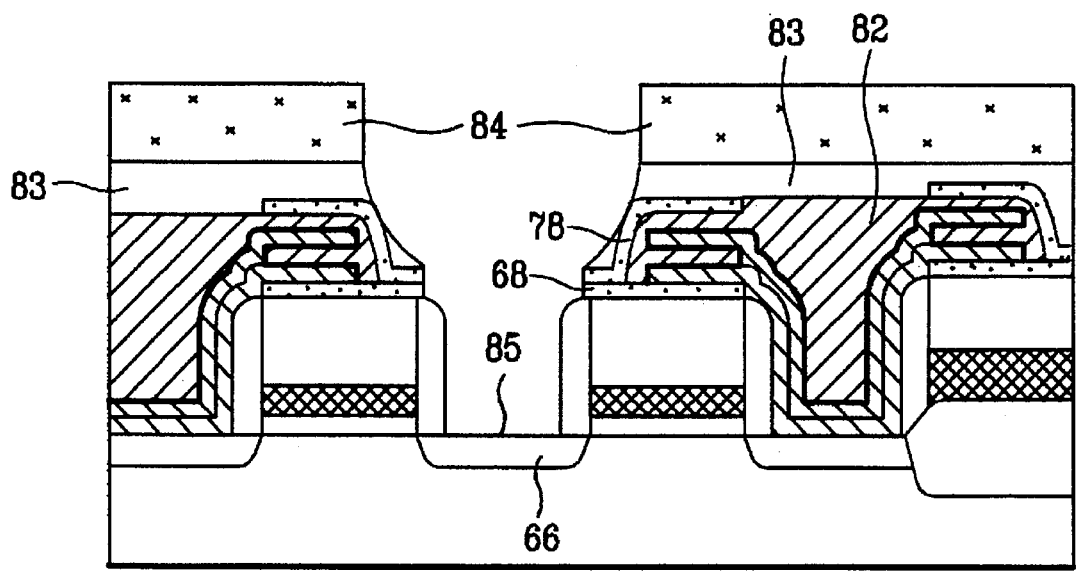

As shown in FIG. 4L, a photosensitive film 84 is coated on the insulation film 83, and a part of the insulation film 84 corresponding to a bit line contact be formed is exposed. By subjecting the insulation film 84 to isotropic etching with the photosensitive film 84 used as a mask, the polycrystalline silicon film 82' remaining on the top of the upperside protection layer 78 is exposed. The insulation film 83 is et etched with a solution containing hydrofluoric acid HF.

By successive etching of the remaining polycrystalline silicon film 82', the upperside protection layer 78, the sacrificing sidewall spacers 76', and the underside protection layer 78, a bit line contact 85 is formed. The bit line contact is formed by dry etching with $SF_6$ or $Cl_2$ gas.

Figure 4M:
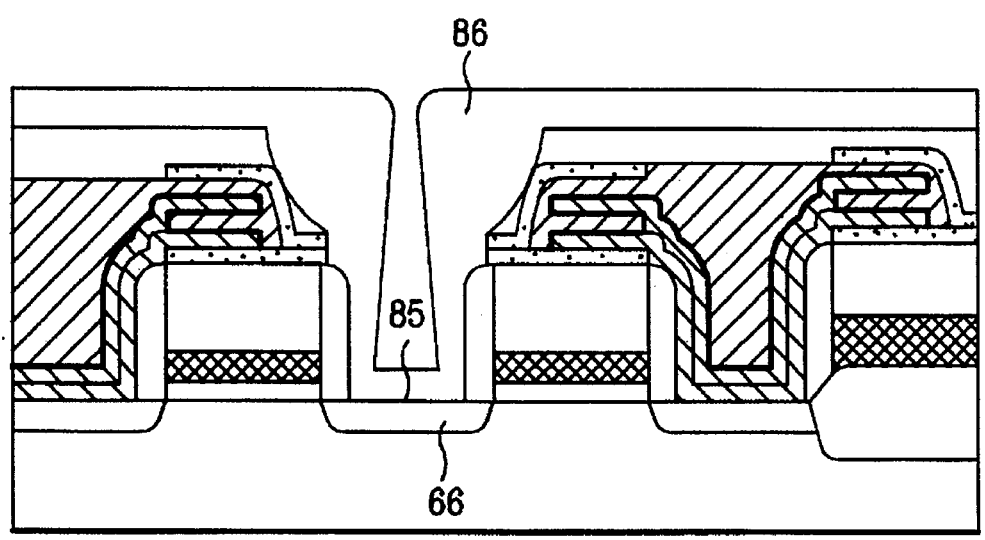

As shown in FIG. 4M, after removing the photosensitive film 84, finally, by depositing a conductive material, such as aluminum on the surface thereof by chemical vapor deposition, a bit line 86 is formed in contact to the impurity region 66 through the bit line contact 85.

As in the first embodiment, the upperside and underside protection films each formed of an insulation film having an etch selectivity over an oxide film, not only protect the plate electrodes at the bit line contact, but also maintain the distance between the bit line and each of the plate electrodes of the capacitors to at least as much as the deposited thickness of the upperside protection layer, and also maintain the distance between each of adjacent storage electrodes and plate electrodes of the capacitors to at least the thickness of the sacrificing sidewall spacer.

This invention as has been explained has following advantages;

In case the distance between a bit line and a plate electrode of a capacitor is reduced as semiconductor memory elements are further miniaturized, since the distance between the bit line and the plate electrode of a capacitor can be maintained to at least the deposited thickness of a protection layer, the plate electrode will remain intact even if misalignment occurs. Also, the insulation property between the bit line and the plate electrode can be improved. Since the distance between a storage electrode and the plate electrode can be maintained constant and at least equal to the thickness of a sacrificing sidewall spacer, the insulation property between the storage electrode of a capacitor and the plate electrode can be improved. Thus, reliability of the element can be improved.

Further, this invention provides an easy fabrication process, since the plate electrode is self-aligned by the upperside and undersigned protection layers.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a semiconductor memory element comprising the steps of:
   the successive formation of gate insulation films and gates on a substrate;
   forming impurity regions in the substrate on both sides of each of the gates by injecting impurity ions thereto;
   forming a first insulation film on the surface thereof;
   forming storage electrode contacts to the impurity regions on one side of each of the gates and an underside protection layer on the impurity region on the other side of each of the gates by subjecting the first insulation film to etching to expose the impurity regions on one side of each of the gates;
   forming a plurality of layered storage electrodes each making contact to the impurity region through the contact;
   forming a plurality of layered sacrificing layers on each of the storage electrodes;
   forming sacrificing sidewall spacers at sidewalls of each of the storage electrodes and the sacrificing layers;
   forming a second insulation film over the entire surface thereof;
   forming an upperside protection layer on the underside protection layer and exposing the sacrificing layers by subjecting the second insulation layers to etching;
   exposing the storage electrodes by etching the exposed sacrificing layers and subsequently etching the sacrificing sidewall spacers;
   forming a dielectric film on each of the exposed storage electrodes; and
   forming a self-aligned plate electrode on each of the dielectric films by etching the dielectric film to a depth sufficient to expose the upperside protection layer.

2. The method of claim 1, further including the steps of:
   forming a third insulation film over the entire surface thereof;
   exposing the upperside protection layer by etching the third insulation film with photosensitive films used as masks;
   forming a bit line contact by etching the upperside protection layer and the underside protection layer until the impurity region is exposed with the photosensitive film used as masks; and
   forming a bit line in contact to the impurity region through the bit line contact.

3. The method as claimed in claim 2, further comprising the step of annealing the third insulation film to moderate steps of the surface thereof after forming the third insulation film.

4. The method as claimed in claim 3, wherein the third insulation film is formed of a BPSG film.

5. The method as claimed in claim 2, wherein the third insulation film is etched so that the third insulation film has a moderate slope.

6. The method as claimed in claim 2, wherein the third insulation film is wet etched with a solution containing hydrofluoric acid.

7. The method as claimed in claim 2, wherein the bit line contact is dry etched with one of $SF_6$ or $Cl_2$.

8. The method as claimed in claim 1, wherein the polycrystalline silicon film is deposited at 560 to 620 deg.C with a chemical vapor deposition method, with one of $SiH_4$ or $Si_2H_6$ used as a raw material gas and $PH_3$ used as a doping gas.

9. The method as claimed in claim 1, wherein each of the upperside and the underside protection layers is formed of a material having an etch selectivity over the sacrificing layer.

10. The method as claimed in claim 1, wherein the, steps of forming the storage electrodes and the sacrificing layers includes the steps of
    depositing a polycrystalline silicon film over the entire surface thereof;
    forming the storage electrodes in contact to the impurity region through the contact by subjecting the polycrystalline silicon film to patterning; and
    forming the sacrificing layer on each of the storage electrodes by forming an insulation film over the entire surface thereof and subjecting the insulation film to patterning.

11. The method as claimed in claim 10, wherein the insulation film for the sacrificing layer is formed of an oxide film.

12. The method as claimed in claim 11, wherein the polycrystalline silicon film for the storage electrodes is deposited at 560 to 620 deg.C with a chemical vapor deposition method, with one $SiH_4$ or $Si_2H_6$ used as a raw material gas and $PH_3$ used as a doping gas.

13. The method as claimed in claim 1, wherein the steps of forming the storage electrodes and the sacrificing layers include the steps of:

depositing a first polycrystalline silicon film in contact to the impurity regions through the contacts over the entire surface thereof;

forming a first insulation film on the first polycrystalline silicon film;

leaving the first insulation film only on the first polycrystalline silicon film on the underside protection layer by subjecting the first insulation film to patterning, depositing a second polycrystalline silicon film on the first polycrystalline silicon film covering the first insulation film;

forming a second insulation film on the second polycrystalline silicon film; and forming bilayered sacrificing layers by etching the second and first insulation films and forming bilayered storage electrodes each making contact to the impurity region through the contact by etching the second and first polycrystalline silicon films.

14. The method as claimed in claim 13, wherein the insulation film for the sacrificing layer is formed of an oxide film.

15. The method as claimed in claim 13, wherein the polycrystalline silicon film for the storage electrodes is deposited at 560 to 620 deg.C with a chemical vapor deposition method with one of $SiH_4$ or $Si_2H_6$ used as a raw material gas and PH3 used as a doping gas.

16. The method as claimed in claim 13, wherein each of the sacrificing layers and each of the storage electrodes are stacked alternatively.

17. The method as claimed in claim 1, wherein each of the sacrificing sidewall spacers is formed of a material identical to the sacrificing layers.

18. The method as claimed in claim 1, wherein the sacrificing layers and the storage electrodes are wet etched with a solution containing hydrofluoric acid.

19. The method as claimed in claim 1, wherein the plate electrodes are formed in self-alignment by forming a polycrystalline silicon film to a certain thickness on all over the surface thereof and subjecting the polycrystalline silicon film to etch back to a depth more than the deposited thickness.

20. The method as claimed in claim 1, wherein the plate electrodes are formed by forming a polycrystalline silicon film to a certain thickness over the entire surface thereof and subjecting the polycrystalline silicon film to etching with photosensitive films used as masks.

* * * * *